(12) United States Patent
Sanuki et al.

(10) Patent No.: US 11,942,176 B2
(45) Date of Patent: Mar. 26, 2024

(54) SEMICONDUCTOR MEMORY DEVICE

(71) Applicant: Kioxia Corporation, Tokyo (JP)

(72) Inventors: Tomoya Sanuki, Yokkaichi Mie (JP);
Xu Li, Yokohama Kanagawa (JP);
Masayuki Miura, Tokyo (JP);
Takayuki Miyazaki, Tokyo (JP);
Toshio Fujisawa, Yokohama Kanagawa (JP); Hiroto Nakai, Yokohama Kanagawa (JP); Hideko Mukaida, Tokyo (JP); Mie Matsuo, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 181 days.

(21) Appl. No.: 17/475,482

(22) Filed: Sep. 15, 2021

(65) Prior Publication Data

US 2022/0301599 A1 Sep. 22, 2022

(30) Foreign Application Priority Data

Mar. 18, 2021 (JP) ................................ 2021-044868

(51) Int. Cl.
| | | |
|---|---|---|
| *G11C 5/00* | (2006.01) | |
| *G11C 5/14* | (2006.01) | |
| *G11C 16/30* | (2006.01) | |
| *H02M 3/158* | (2006.01) | |
| *H10B 41/27* | (2023.01) | |
| *H10B 43/27* | (2023.01) | |

(52) U.S. Cl.
CPC ................ *G11C 5/14* (2013.01); *G11C 16/30* (2013.01); *H02M 3/1582* (2013.01); *H10B 41/27* (2023.02); *H10B 43/27* (2023.02)

(58) Field of Classification Search
CPC ......... G11C 5/147; G11C 16/30; G11C 5/145; G11C 16/0483; G11C 16/26; G11C 11/4074; G11C 11/5642; G11C 11/5671; G11C 16/08; G11C 5/14; G11C 8/12; G11C 17/18; G11C 5/025; G11C 5/063; G11C 7/00; G11C 7/02; H01L 27/0688; H01L 27/08; H01L 2224/48227; H01L 2224/73265; H01L 23/5252; H01L 25/0657; H01L 27/101; H01L 2924/0002; H01L 2924/19042; H01L 2924/19104
USPC ................................................... 365/226, 227
See application file for complete search history.

(56) References Cited

U.S. PATENT DOCUMENTS

| | | | |
|---|---|---|---|
| 5,572,478 A * | 11/1996 | Sato | G11C 5/147 365/226 |
| 9,160,346 B2 | 10/2015 | Khawshe et al. | |
| 9,391,453 B2 | 7/2016 | Droege et al. | |
| 9,607,927 B2 | 3/2017 | Umemoto | |
| 10,193,442 B2 * | 1/2019 | Parto | G05F 1/46 |
| 2005/0237039 A1 | 10/2005 | Kikuchi et al. | |
| 2011/0260781 A1 | 10/2011 | Takeuchi et al. | |

FOREIGN PATENT DOCUMENTS

JP 6662944 B2 3/2020

* cited by examiner

*Primary Examiner* — Thong Q Le
(74) *Attorney, Agent, or Firm* — Allen & Overy LLP

(57) ABSTRACT

A semiconductor memory device has a plastic package including an inductor, a first memory chip including a booster circuit that boosts a voltage from a first voltage to a second voltage using the inductor, and a second memory chip having a terminal supplied with the second voltage from the first memory chip.

19 Claims, 6 Drawing Sheets

SEMICONDUCTOR MEMORY DEVICE

CROSS REFERENCE TO RELATED APPLICATIONS

This application is based upon and claims the benefit of priority from the prior Japanese Patent Application No. 2021-044868, filed on Mar. 18, 2021, the entire contents of which are incorporated herein by reference.

FIELD

An embodiment of the present disclosure relates to a semiconductor memory device.

BACKGROUND

A non-volatile memory such as a flash memory has been increasing in density and performance, and power consumption and an amount of heat generation at the time of operation are tending to increase.

DETAILED DESCRIPTION

According to one embodiment a semiconductor memory device has a plastic package including an inductor, a first memory chip including a booster circuit that boosts a voltage from a first voltage to a second voltage using the inductor, and a second memory chip having a terminal supplied with the second voltage from the first memory chip.

Hereinafter, embodiments of a semiconductor memory device are described with reference to the drawings. Although main components of the semiconductor memory device are mainly described below, the semiconductor memory device may have components and functions that are not illustrated or described. The following description does not exclude components and functions that are not illustrated or described.

First Embodiment

Figure 1:
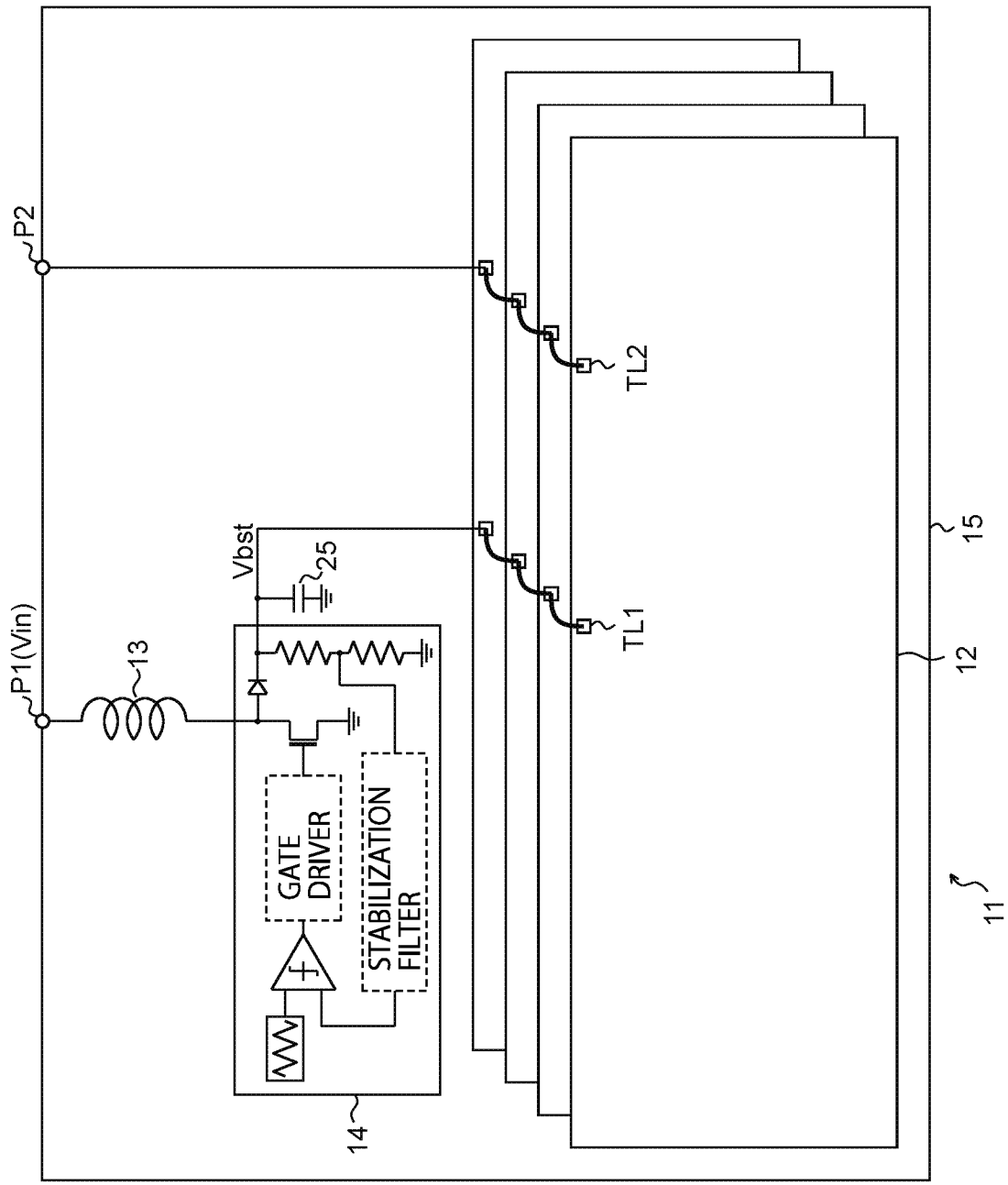
FIG. 1 is a diagram illustrating a schematic configuration of a semiconductor memory device according to a first embodiment.

FIG. 1 is a diagram illustrating a schematic configuration of a semiconductor memory device 11 according to a first embodiment. The semiconductor memory device 11 in FIG. 1 includes a memory chip 12 having a non-volatile memory cell.

The non-volatile memory cell has a charge storage region, and stores electric charge in the charge storage region according to write data. The present embodiment can be widely applied to the semiconductor memory device 11 having the non-volatile memory cell having such a charge storage region. A representative example of the semiconductor memory device 11 according to the present embodiment is a flash memory. As the flash memory, there are a NAND type and a NOR type, but the present embodiment is applicable to both types. The flash memory includes a floating gate and a charge trap film as the charge storage region, but in the present embodiment, the type of the charge storage region is not limited. Hereinafter, the memory chip 12 including the NAND flash memory is mainly described.

The semiconductor memory device 11 in FIG. 1 includes a package 15 in which the memory chip 12 described above, an inductor 13, and a booster circuit 14 are accommodated. There are plural types of the package 15 having different shapes and sizes, but the type of the package 15 is not limited in the present embodiment. Typical examples of the package 15 to which the present embodiment can be applied include a single in-line package (SIP), a zigzag in-line package (ZIP), a Dual In-line Package (DIP), a Pin Grid Array (PGA), a Small Outline Package (SOP), a Small Outline J-leaded package (SOJ), a Small Outline Non-leaded package (SON), a Quad Flat Package (QFP), a Quad Flat J-leaded package (QFJ), a Quad Flat Non-leaded package (QFN), a Land Grid Array (LGA), and a Ball Grid Array (BGA), but other packages 15 may be used.

The booster circuit 14 accommodated in the package 15 boosts a reference voltage Vin using the inductor 13. The reference voltage Vin is supplied from the outside of the package 15 via a pin P1 of the package 15. The reference voltage Vin may be a power supply voltage of the semiconductor memory device 11. The voltage level of the reference voltage Vin is assumed to be generally used in a substrate on which the package 15 of the semiconductor memory device 11 is mounted, and is, for example, about 2.5 V or 3.3 V.

In a normal NAND flash memory, because a high voltage of about 12 V or 26 V is used at the time of reading and writing (programming), the reference voltage Vin of a low voltage of about 2.5 V is input to the NAND flash memory, and then a high voltage is generated by a booster circuit built in the NAND flash memory. The booster circuit is generally constituted of a charge pump using a capacitor. Most of the power consumed by the charge pump is used for the operation of the charge pump raising a voltage level, and the power consumed when the reading and writing is performed with the high voltage generated by the charge pump is only a few percent of the total power consumption. The fact that a large amount of power is consumed in the operation of raising the voltage level means that the power consumption becomes heat, and there is a problem that the booster circuit that boosts the voltage using the charge pump generates a large amount of heat.

Recently, a technique of mounting more NAND memory chips 12 in one package 15 at high density has been advancing, and miniaturization and integration of each NAND memory chip 12 have also been advancing. Because a normal NAND memory chip includes a booster circuit therein, the amount of heat generation and power consumption of the package 15 increase as the NAND memory chip 12 is more densely mounted in the package 15. In particular, recently, a high-density mounting technique for stacking a large number of NAND memory chips 12 has been put into practical use. In the case in which a large number of NAND memory chips 12 are stacked and packaged, the booster circuit 14 in each NAND memory chip 12 is arranged close to each other in the vertical direction, and there is a possibility that the amount of heat generation at a specific location in the package 15 becomes significantly large.

The upper limit of the temperature at which the NAND memory chip 12 can stably operate is about 85° C. Therefore, a memory system including the NAND memory chip 12 includes a mechanism for monitoring the temperature of the NAND memory chip 12 and reducing the access speed and performance of the NAND memory chip 12 when the temperature is likely to exceed 85° C., and the mechanism of this type is called thermal throttling.

Recent electronic devices tend to be lighter, thinner, shorter, and smaller, and there is a need for the package 15 in which highly integrated NAND memory chips 12 are mounted at high density. Because this type of package 15 has no free space therein, heat dissipation performance is often poor, and the temperature of the NAND memory chip 12 tends to rise easily. For this reason, the above-described thermal throttling is required, but a decrease in access speed and performance of the NAND memory chip 12 due to the thermal throttling causes a decrease in performance of the electronic device such as a smartphone, a tablet, a PC, or a data server.

From the above background, in the present embodiment, the booster circuit 14 in the package 15 boosts the voltage by using the inductor 13 without using the charge pump. As a result, the power consumption and the amount of heat generation of the booster circuit 14 can be suppressed, and the power efficiency can be improved.

In the present embodiment, the memory chip 12 does not include the booster circuit 14, and the booster circuit 14 is provided in the package 15 separately from the memory chip 12. A boosted voltage Vbst boosted by the booster circuit 14 is supplied to a terminal (first terminal) TL1 of the memory chip 12. In a case in which a plurality of the memory chips 12 are provided in the package 15, by the plurality of memory chips 12 sharing one booster circuit 14, the amount of heat generation can be further suppressed and the power efficiency can be further improved.

Note that the number of memory chips 12 accommodated in the package 15 of the present embodiment is not limited, and only one memory chip 12 may be provided, or a plurality of memory chips 12 may be provided.

The package 15 in FIG. 1 incorporates the inductor 13. The inductor 13 is, for example, a spiral or annular wiring pattern formed on a substrate. One end of the inductor 13 is connected to the booster circuit 14, and the other end of the inductor 13 is connected to the pin P1 of the package 15. The pin P1 is a place where signals are exchanged with the outside of the package 15, and may be referred to as a terminal or a pad, but is referred to as the pin P1 in the present specification. The reference voltage Vin is supplied to the other end of the inductor 13 from the outside of the package 15 via the pin P1.

In addition, the package 15 in FIG. 1 may have a pin (second pin) P2 connected to the terminal of the memory chip 12. The type of a signal input to and output from the second pin P2 is not particularly limited.

The memory chip 12 includes the terminal TL1 to which the boosted voltage Vbst boosted by the booster circuit 14 is supplied, and a terminal (second terminal) TL2 connected to a pin (second pin) P2 of the package 15. The voltage level of the signal transmitted and received between the terminal TL2 and the second pin P2 is assumed to be lower than the voltage level of the boosted voltage Vbst.

Figure 2:
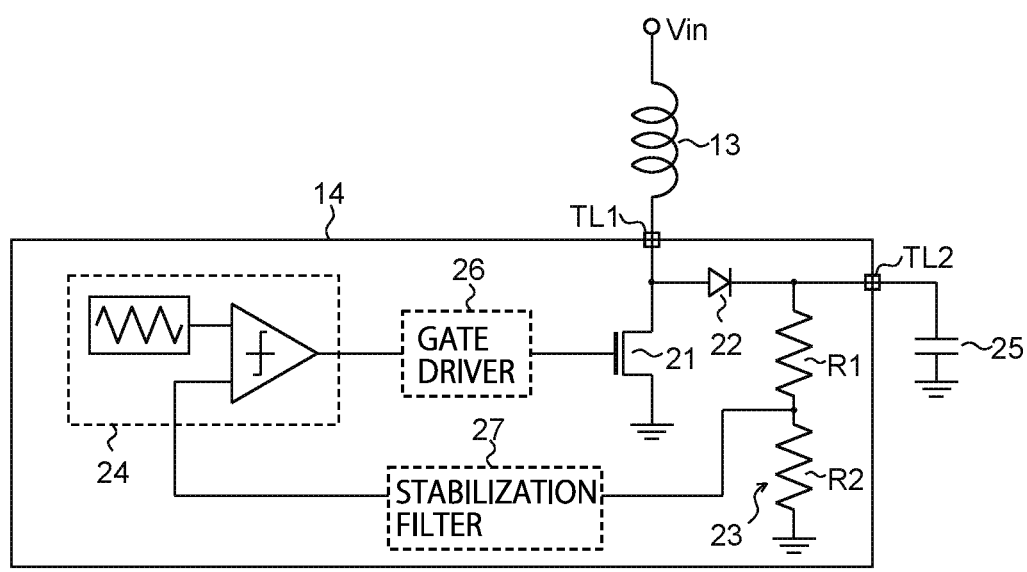
FIG. 2 is a circuit diagram illustrating an example of an internal configuration of a booster circuit.

FIG. 2 is a circuit diagram illustrating an example of an internal configuration of the booster circuit 14. The booster circuit 14 in FIG. 2 includes a switching element 21, a diode 22 (rectifier circuit), a resistor voltage divider circuit 23, and a control circuit 24. The inductor 13 and a capacitor 25 are connected to the booster circuit 14. Although the inductor 13 and the capacitor 25 can also be referred to as the booster circuit 14, the inductor 13 and the capacitor 25 are not included in the booster circuit 14 in the present embodiment.

As illustrated in FIG. 1, the inductor 13 is connected between the first pin P1 of the package 15 and the first terminal TL1 of the memory chip 12. The switching element 21 in the booster circuit 14 is connected between the first terminal TL1 and a ground node. More specifically, the switching element 21 can be constituted of a metal oxide semiconductor (MOS) transistor 21. Although FIG. 1 illustrates an example in which the switching element 21 is the NMOS transistor 21, the switching element 21 may be the PMOS transistor 21. Hereinafter, the switching element 21 constituted of, for example, the NMOS transistor 21 is simply referred to as the transistor 21.

A drain of the transistor 21 is connected to the first terminal TL1, and a source is connected to the ground node. An anode of the diode 22 is connected to the drain of the transistor 21. A cathode voltage of the diode 22 is the output voltage (boosted voltage Vbst) of the booster circuit 14. The resistor voltage divider circuit 23 and the capacitor 25 are connected in parallel between the cathode of the diode 22 and the ground node. For example, the diode 22 includes a P-type semiconductor layer arranged on a substrate and an N-type semiconductor layer arranged on the substrate so that a PN junction is formed at an interface portion with the P-type semiconductor layer.

The resistor voltage divider circuit 23 feeds back, to the control circuit 24, a voltage obtained by dividing the cathode voltage of the diode 22 by a ratio (voltage dividing ratio) of resistance values of two resistor elements R1 and R2. The control circuit 24 controls a gate voltage of the transistor 21 such that the divided voltage from the resistor voltage divider circuit 23 matches a predetermined reference voltage. For example, the resistor elements R1 and R2 are polysilicon layers or metal layers arranged on a substrate.

Because the inductor 13 can store power with high efficiency, the output voltage of the booster circuit 14 output from the cathode of the diode 22 can be made higher than the reference voltage Vin. The capacitor 25 is provided to smooth the output voltage of the booster circuit 14.

As indicated by a broken line in FIG. 2, the booster circuit 14 may include at least one of a gate driver 26 and a stabilization filter 27. The gate driver 26 converts an output voltage of the control circuit 24 into a voltage level suitable for the gate voltage of the transistor 21. The stabilization filter 27 suppresses noise of the divided voltage output from the resistor voltage divider circuit 23.

Figure 3:
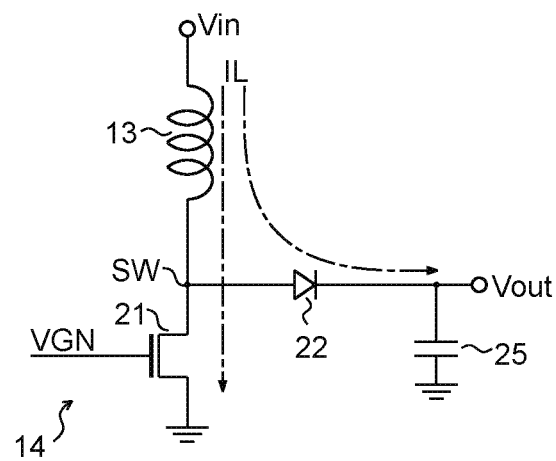
FIG. 3 is a diagram for explaining a mechanism in which a booster circuit boosts a reference voltage.
Figure 4:
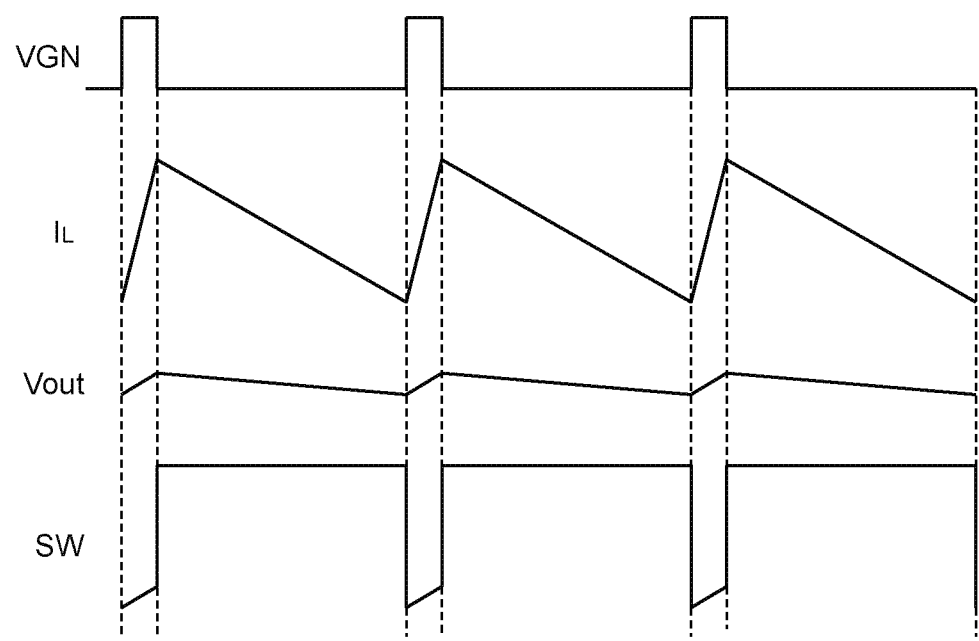
FIG. 4 is a voltage waveform diagram of each unit in FIG. 3.

FIG. 3 is a diagram for explaining a mechanism in which the booster circuit 14 boosts the reference voltage Vin, and FIG. 4 is a voltage waveform diagram of each unit in FIG. 3. FIG. 4 illustrates a waveform of the gate voltage of the transistor 21 in the booster circuit 14, a waveform of current flowing through the inductor 13, a waveform of the output voltage (boosted voltage Vbst) of the booster circuit 14, and a waveform of a drain voltage of the transistor 21.

A pulsed voltage signal VGN is periodically input to a gate of the transistor 21. As a result, the transistor 21 is periodically turned on. When the transistor 21 is turned on, a current flows from the inductor 13 and between the drain and the source of the transistor 21, and the power is stored in the inductor 13. As illustrated in FIG. 4, the current flowing through the inductor 13 increases substantially linearly during a period in which the transistor 21 is turned on. When the transistor 21 is turned off, the power stored in the inductor 13 causes the current to flow from the inductor 13 to the capacitor 25 through the diode 22. During a period in which the transistor 21 is off, the current flowing through the inductor 13 decreases substantially linearly. As illustrated in FIG. 4, the drain voltage of the transistor 21 decreases substantially close to the ground voltage during the period in which the transistor 21 is turned on, and becomes a substantially constant voltage during the period in which the transistor is turned off. Because the capacitor 25 performs a function of smoothing the boosted voltage Vbst, the boosted voltage Vbst becomes a voltage substantially close to a DC voltage although there is a slight ripple.

A power loss in the booster circuit 14 according to the present embodiment is mainly caused by a copper loss of the inductor 13, an on-resistance of the transistor 21, an on-resistance of the diode 22, and the like, but the power loss can be suppressed as compared with a case in which the booster circuit is constituted of the charge pump. Therefore, the amount of heat generation can be suppressed as compared with the case in which the booster circuit is constituted of the charge pump.

The booster circuit 14 illustrated in FIGS. 1 and 2 may be configured by mounting a discrete circuit component on a substrate, or may be accommodated in a chip separate from the memory chip 12.

Figure 5:
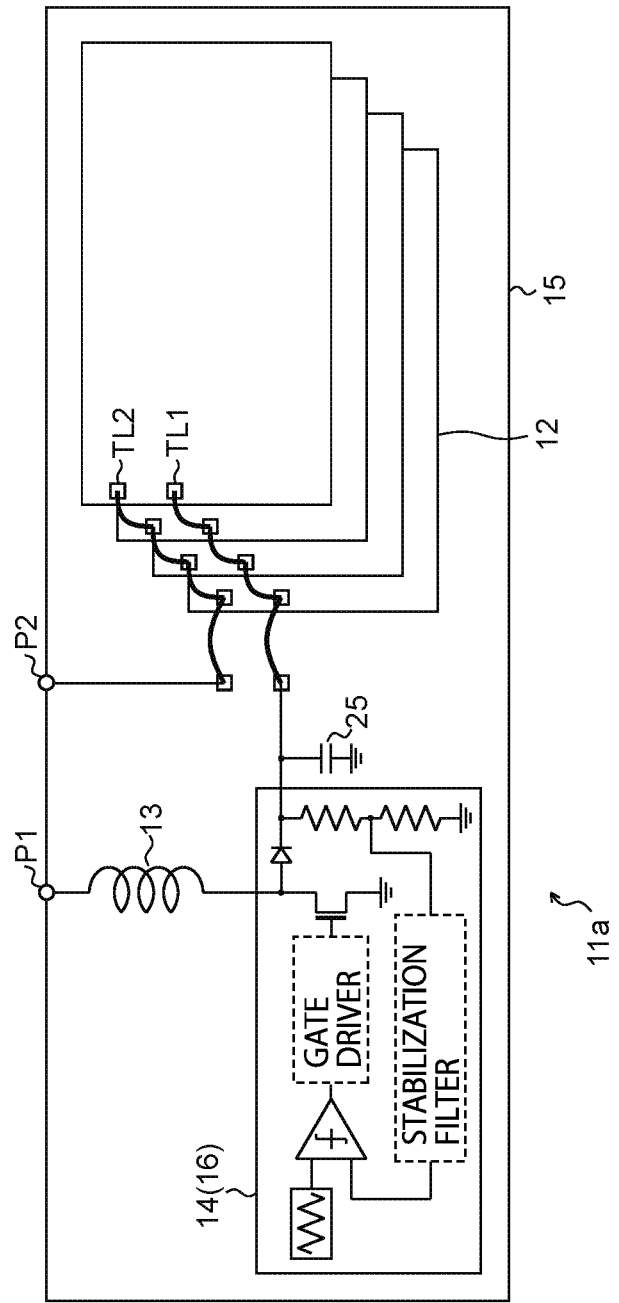
FIG. 5 is a diagram illustrating an example in which a chip accommodating a booster circuit is arranged in a package.

FIG. 5 is a diagram illustrating a schematic configuration of a semiconductor memory device 11a in which a chip 16 accommodating the booster circuit 14 is arranged in the package 15. The plurality of memory chips 12 and the chip 16 in which the booster circuit 14 is accommodated are arranged inside the package 15 in FIG. 5. Because the inductor 13 and the capacitor 25 connected to the booster circuit 14 are difficult to form in the chip 16, the two are arranged in the package 15 separately from the chip 16. As illustrated in FIG. 5, the package 15 can be easily manufactured by forming the booster circuit 14 as the chip 16. In addition, a plurality of the chips 16 having the same type or different types of booster circuits 14 may be arranged in the package 15.

As described above, in the semiconductor memory devices 11 and 11a according to the first embodiment, because the booster circuit 14 that generates the boosted voltage Vbst using the inductor 13 is provided in the package 15 separately from the memory chip 12, the power consumption and heat generation of the memory chip 12 can be reduced. According to the package 15 of the present embodiment, because the boosted voltage Vbst can be supplied from one booster circuit 14 to the plurality of memory chips 12, the power consumption and heat generation of the package 15 can be suppressed more as the number of memory chips 12 stacked in the package 15 increases. In particular, in a case in which the booster circuit 14 is provided in the memory chip 12, by stacking the plurality of memory chips 12, the plurality of booster circuits 14 are arranged close to each other vertically, and heat generation at a specific location in the package 15 increases. However, in the present embodiment, because the booster circuit 14 is not provided in the memory chip 12, there is no risk that the temperature at the specific location in the package 15 becomes abnormally high. In addition, because the booster circuit 14 according to the present embodiment generates the boosted voltage Vbst using the inductor 13 instead of the charge pump, the power efficiency can be improved as compared with the booster circuit using the charge pump.

In the above-described first embodiment, an example has been shown in which the inductor 13 is a spiral or annular wiring pattern of formed on the substrate, but a concrete form and shape of the inductor 13 is not limited to that of the above-described example. The inductor 13 has to be provided to meet a connection relationship with the above-described other elements.

Second Embodiment

In the first embodiment, the booster circuit 14 is provided in the package 15 separately from the memory chip 12, but the booster circuit 14 may be disposed in the memory chip 12.

Figure 6:
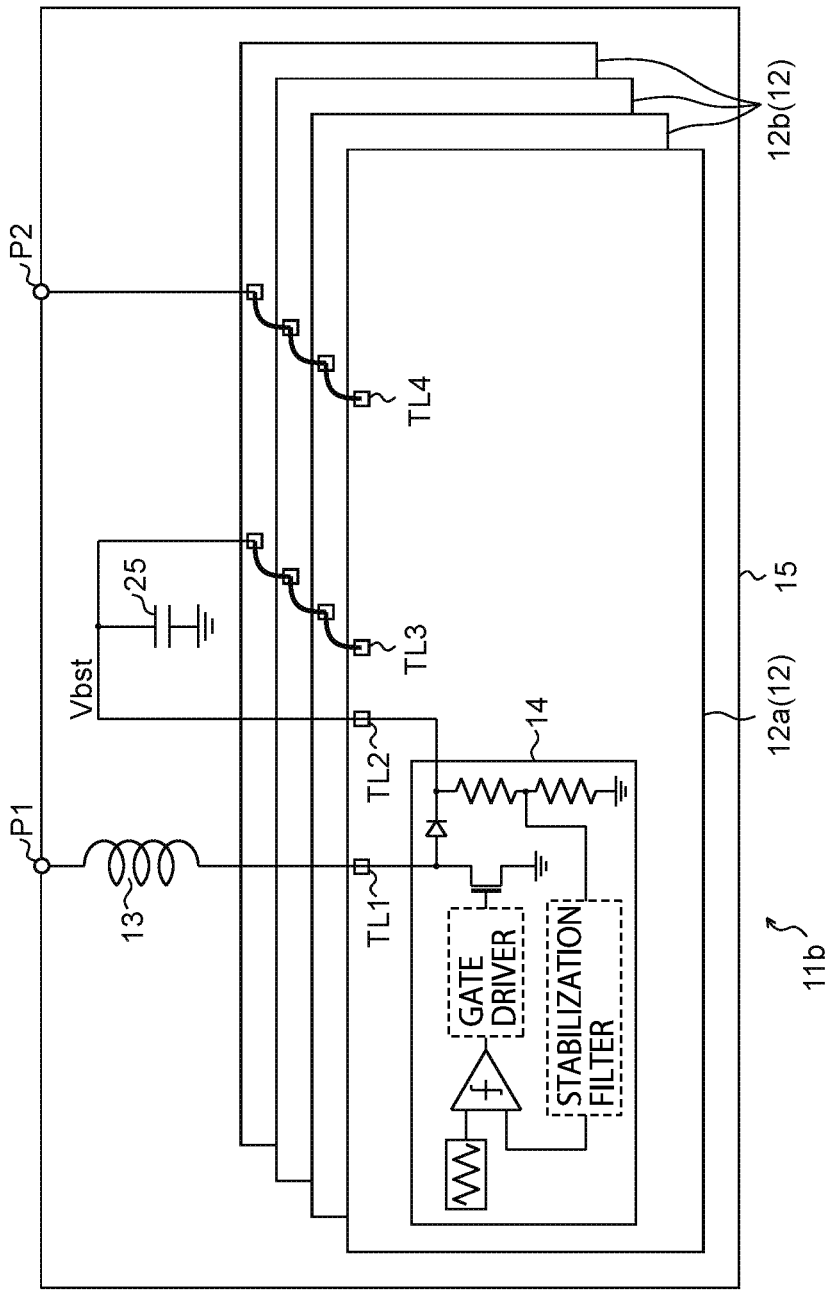
FIG. 6 is a diagram illustrating a schematic configuration of a semiconductor memory device according to a second embodiment.

FIG. 6 is a diagram illustrating a schematic configuration of a semiconductor memory device 11b according to a second embodiment. The semiconductor memory device 11 in FIG. 6 includes a plurality of memory chips 12 arranged in a package 15.

The memory chip 12 in the semiconductor memory device 11 in FIG. 6 includes a first memory chip 12a and a second memory chip 12b. The first memory chip 12a includes a booster circuit 14 that boosts a first voltage to a second voltage using an inductor 13. The second memory chip 12b has a terminal supplied with the second voltage from the first memory chip 12a. In a case in which there are a plurality of the second memory chips 12b, the second voltage is supplied from the first memory chip 12a to each of the plurality of second memory chips 12b. Note that there may be a plurality of the first memory chips 12a and the plurality of second memory chips 12b.

The package 15 is specifically a plastic package. The plastic package includes a resin body that covers the inductor 13 and the memory chip 12. The resin body is formed of, for example, an epoxy resin.

In the package 15, the inductor 13 and a capacitor 25 are accommodated in addition to the plurality of memory chips 12. One end of the capacitor 25 is connected to an output node of a rectifier circuit 22, and the other end of the capacitor 25 is set to a ground potential.

The first memory chip 12a incorporates the booster circuit 14, and the second memory chip 12b does not incorporate the booster circuit 14. The boosted voltage Vbst generated in the first memory chip 12a incorporating the booster circuit 14 is used for writing in a NAND flash memory in the first memory chip 12a, and is supplied to the second memory chip 12b not including the booster circuit 14. The inductor 13 connected to a transistor 21 in the booster circuit 14 and the capacitor 25 arranged between a cathode of the diode 22 and a ground node are difficult to be arranged in the first memory chip 12a because of their large size. Therefore, the inductor 13 and the capacitor 25 are arranged in the package 15 separately from the first memory chip 12a.

The first memory chip 12a has a first terminal TL1 connected to one end of the inductor 13 and a second terminal TL2 connected to the output node of the rectifier circuit 22 and one end of the capacitor 25. The first memory chip 12a and the second memory chip 12b each have a third terminal TL3 connected to one end of the capacitor 25. The first memory chip 12a and the second memory chip 12b each have a fourth terminal TL4 supplied with a third voltage lower than the second voltage.

As described above, in the second embodiment, the booster circuit 14 is provided in at least one memory chip 12 among the plurality of memory chips 12 arranged in the package 15. Then, the boosted voltage Vbst generated by the booster circuit 14 is supplied to the memory chip 12 not including the booster circuit 14. As a result, it is not necessary to provide the booster circuit 14 in most of the memory chips 12 in the package 15, and the power consumption and heat generation can be suppressed. In addition, similarly to the booster circuit 14 of the first embodiment, because the booster circuit 14 of the present embodiment boosts the voltage by using the inductor 13 instead of the charge pump, the power efficiency can be improved.

The inductor 13 of the second embodiment may be the spiral or annular wiring pattern formed on the substrate, as shown in the first embodiment. The inductor 13 has to be provided to meet a connection relationship with the above-described other elements.

Third Embodiment

A third embodiment illustrates a specific configuration of a memory system 10 including the semiconductor memory device according to the first or second embodiment.

Figure 7:
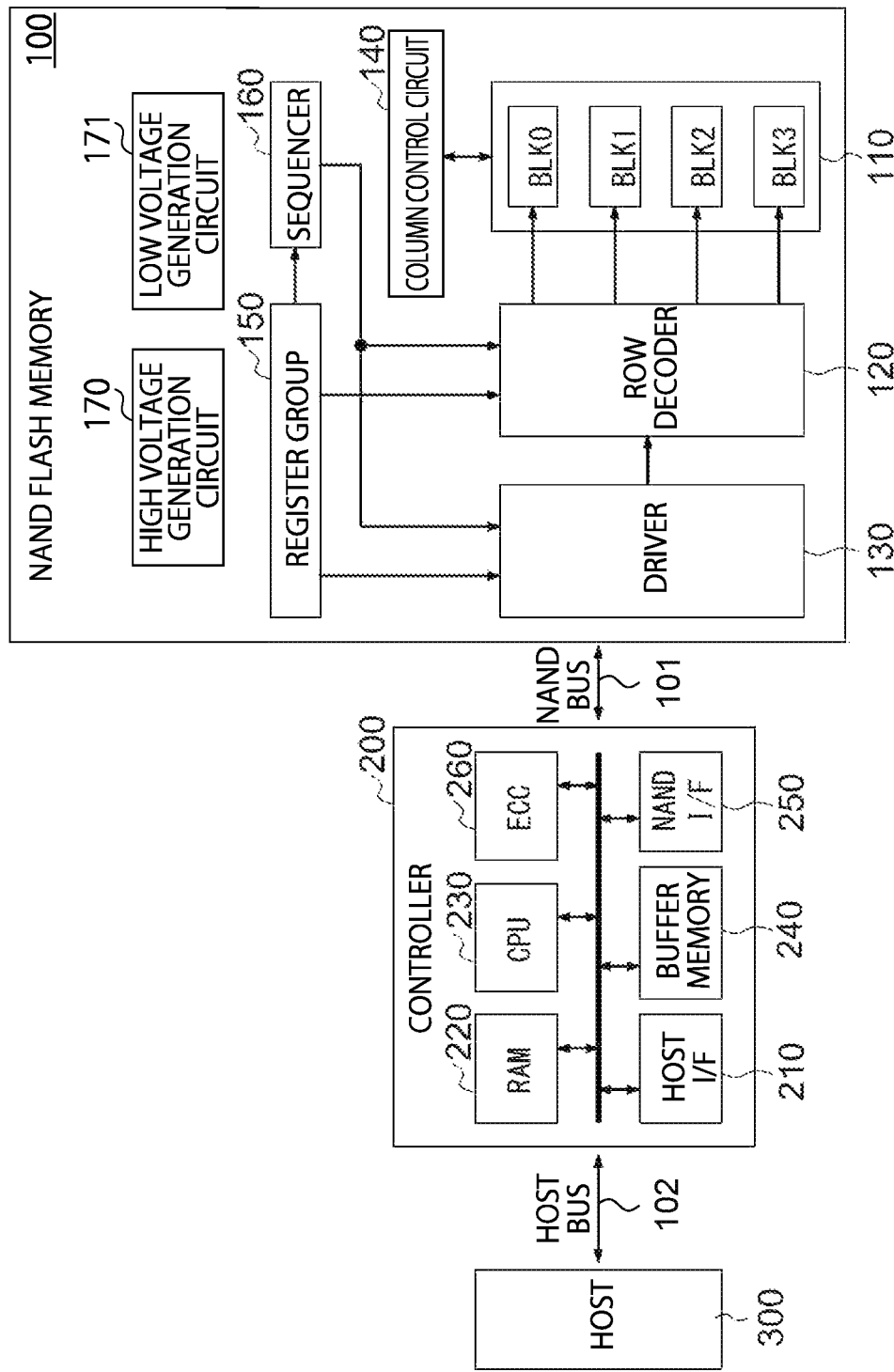
FIG. 7 is a block diagram illustrating a schematic configuration of a memory system including a semiconductor memory device according to a first or second embodiment.

FIG. 7 is a block diagram illustrating a schematic configuration of the memory system 10 including the semiconductor memory device 11, 11a, or 11b according to the first or second embodiment. Hereinafter, an example in which the semiconductor memory device 11, 11a, or 11b is a NAND flash memory 100 is described. The memory system in FIG. 7 is, for example, a solid state drive (SSD).

The memory system 10 in FIG. 7 includes the NAND flash memory 100 and a controller 200. As will be described later, there is a case in which the NAND flash memory 100 and the controller 200 are mounted on separate substrates.

The NAND flash memory 100 in FIG. 7 includes a plurality of memory cells and stores data in a non-volatile manner. The NAND flash memory 100 in FIG. 7 includes the NAND memory chip 12 in FIG. 1 and the like.

The controller 200 may be connected to the NAND flash memory 100 by, for example, a NAND bus 101 provided in a signal transmission cable 2 illustrated in FIG. 9 to be described later, and may be connected to a host device 300 by a host bus 102. The controller 200 controls the NAND flash memory 100 and accesses the NAND flash memory 100 in response to a command received from the host device 300. The host device 300 is, for example, an electronic device such as a personal computer, and the host bus is a bus conforming to various interfaces. The NAND bus transmits and receives signals according to a NAND interface such as Toggle IF.

The controller 200 includes a host interface circuit 210, a built-in memory (random access memory (RAM)) 220, a processor (central processing unit (CPU)) 230, a buffer memory 240, a NAND interface circuit 250, and an error checking and correcting (ECC) circuit 260.

The host interface circuit 210 is connected to the host device 300 via the host bus, and transfers a command and data received from the host device 300 to the CPU 230 and the buffer memory 240, respectively. In response to a command from the CPU 230, data in the buffer memory 240 is transferred to the host device 300.

The CPU 230 controls the entire operation of the controller 200. For example, upon receiving a write command from the host device 300, the CPU 230 issues the write command to the NAND interface circuit 250 in response to the write command. The same applies to reading and erasing. In addition, the CPU 230 executes various types of processing for managing the NAND flash memory 100, such as wear leveling. The operation of the controller 200 described below may be realized by executing firmware by the CPU, or may be realized by hardware.

The NAND interface circuit 250 is connected to the NAND flash memory 100 via the NAND bus in the signal transmission cable 2 and manages communication with the NAND flash memory 100. Then, based on a command received from the CPU 230, the NAND interface circuit 250 transmits various signals to the NAND flash memory 100 and receives the signals from the NAND flash memory 100. The buffer memory 240 temporarily holds write data and read data.

The RAM 220 is, for example, a semiconductor memory 5 such as a dynamic RAM (DRAM) or a static RAM (SRAM), and is used as a work area of the CPU 230. Then, the RAM 220 holds firmware for managing the NAND flash memory 100, various management tables, and the like.

The ECC circuit 260 performs error detection and error correction processing on data stored in the NAND flash memory 100. That is, the ECC circuit 260 generates an error correction code at the time of writing data, adds the error correction code to the write data, and decodes the error correction code at the time of reading the data.

Next, a configuration of the NAND flash memory 100 is described. As illustrated in FIG. 7, the NAND flash memory 100 includes a memory cell array 110, a row decoder 120, a driver circuit 130, a column control circuit 140, a register group 150, a sequencer 160, a high voltage generation circuit 170, and a low voltage generation circuit 171.

The memory cell array 110 includes a plurality of blocks BLK including a plurality of non-volatile memory cells associated with rows and columns. FIG. 7 illustrates four blocks BLK0 to BLK3 as an example. Also, the memory cell array 110 stores data given from the controller 200.

The row decoder 120 selects one of the blocks BLK0 to BLK3, and further selects a row direction in the selected block BLK. The driver circuit 130 supplies a voltage to the selected block BLK via the row decoder 120.

When reading data, the column control circuit 140 senses data read from the memory cell array 110 and performs a necessary operation. Then, this data DAT is output to the controller 200. At the time of writing data, the write data DAT received from the controller 200 is transferred to the memory cell array 110.

The register group 150 includes an address register, a command register, and the like. The address register holds an address received from the controller 200. The command register holds a command received from the controller 200.

The sequencer 160 controls the entire operation of the NAND flash memory 100 based on various types of information held in the register group 150.

The high voltage generation circuit 170 and the low voltage generation circuit 171 generate an internal power supply voltage corresponding to the reference voltage Vin input to the NAND flash memory 100. The high voltage generation circuit 170 generates a program voltage or the like having a high voltage level when data is written to a memory cell. For example, the voltage is used as an input voltage to a driver and a row decoder in the NAND flash memory 100. The low voltage generation circuit 171 generates an internal voltage having a low voltage level for driving the digital circuit. This internal voltage is used as, for example, an input voltage to the register group, the sequencer, and the column control circuit 140 in the NAND flash memory 100.

In the memory system 10 according to the present embodiment, two voltages of a low voltage and a high voltage can be used as the reference voltage Vin input to the NAND flash memory 100, and the high voltage is input to the high voltage generation circuit 170. Because the high voltage generation circuit 170 is more efficient when an internal voltage is generated from a high voltage, heat generation can be suppressed, and the power consumption can be reduced.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor memory device comprising
a plastic package including:
an inductor;
a first memory chip including a booster circuit that boosts a voltage from a first voltage to a second voltage using the inductor; and
a second memory chip having a terminal supplied with the second voltage from the first memory chip, wherein
booster circuit includes:
a switching element having one end connected to the inductor and another end having a ground potential;
a rectifier circuit that is connected to the inductor and rectifies an output voltage of the switching element; and
a control circuit that performs switching control of turning on or off the switching element according to an output voltage of the rectifier circuit, and
the plastic package includes a capacitor having one end connected to an output node of the rectifier circuit and another end having a potential of the ground potential,
the first memory chip includes a first terminal connected to one end of the inductor and a second terminal connected to the output node and the one end of the capacitor, and
each of the first memory chip and the second memory chip includes a third terminal connected to the one end of the capacitor, and a fourth terminal supplied with a third voltage lower than the second voltage, and
the plastic package further includes a first pin supplied with the first voltage and connected to another end of the inductor, and a second pin supplied with the third voltage and connected to the second terminal.

2. The semiconductor memory device according to claim 1, wherein
the output voltage of the switching element is output from a connection path between the switching element and the inductor.

3. The semiconductor memory device according to claim 1, wherein
the capacitor is arranged inside the plastic package separately from the first memory chip and the second memory chip.

4. The semiconductor memory device according to claim 1, wherein
the plastic package includes a resin body that covers the inductor, the first memory chip, and the second memory chip.

5. The semiconductor memory device according to claim 1, wherein
the rectifier circuit includes a P-type semiconductor layer arranged on a substrate, and an N-type semiconductor layer arranged on the substrate such that a PN junction is formed at an interface portion with the P-type semiconductor layer.

6. The semiconductor memory device according to claim 1, wherein
the switching element includes a metal oxide semiconductor (MOS) transistor arranged on a substrate.

7. The semiconductor memory device according to claim 1, wherein
the booster circuit includes a plurality of resistor elements that generate a divided voltage obtained by dividing an output voltage of the rectifier circuit,
the control circuit performs switching control of turning on or off the switching element according to the divided voltage, and
the plurality of resistor elements is a polysilicon layer or a metal layer arranged on a substrate.

8. The semiconductor memory device according to claim 1, wherein
the inductor includes a spiral or annular wiring pattern arranged on a substrate.

9. The semiconductor memory device according to claim 1, wherein
each of the first memory chip and the second memory chip includes at least one of a NAND flash memory and a NOR flash memory.

10. A semiconductor memory device comprising
a plastic package including:
an inductor;
a first memory chip including a booster circuit that boosts a voltage from a first voltage to a second voltage using the inductor; and
a second memory chip having a terminal supplied with the second voltage from the first memory chip, wherein
the first and second memory chips perform data writing by the second voltage, wherein
the booster circuit includes:
a switching element having one end connected to the inductor and another end having a ground potential;
a rectifier circuit that is connected to the inductor and rectifies an output voltage of the switching element; and
a control circuit that performs switching control of turning on or off the switching element according to an output voltage of the rectifier circuit, and
the plastic package includes a capacitor having one end connected to an output node of the rectifier circuit and another end having a potential of the ground potential.

11. The semiconductor memory device according to claim 10, wherein
the capacitor is arranged inside the plastic package separately from the first memory chip and the second memory chip.

12. The semiconductor memory device according to claim 10, wherein
the first memory chip includes a first terminal connected to one end of the inductor and a second terminal connected to the output node and the one end of the capacitor, and
each of the first memory chip and the second memory chip includes a third terminal connected to the one end of the capacitor.

13. The semiconductor memory device according to claim 12, wherein each of the first memory chip and the second memory chip includes a fourth terminal supplied with a third voltage lower than the second voltage, and the plastic package includes a first pin supplied with the first voltage and connected to another end of the inductor, and a second pin supplied with the third voltage and connected to the second terminal.

14. The semiconductor memory device according to claim 10, wherein the plastic package includes a resin body that covers the inductor, the first memory chip, and the second memory chip.

15. The semiconductor memory device according to claim 10, further comprising a plurality of the second memory chips each supplied with the second voltage from the first memory chip.

16. The semiconductor memory device according to claim 10, wherein the rectifier circuit includes a P-type semiconductor layer arranged on a substrate, and an N-type semiconductor layer arranged on the substrate such that a PN junction is formed at an interface portion with the P-type semiconductor layer.

17. The semiconductor memory device according to claim 10, wherein the switching element includes a metal oxide semiconductor (MOS) transistor arranged on a substrate.

18. The semiconductor memory device according to claim 10, wherein the booster circuit includes a plurality of resistor elements that generate a divided voltage obtained by dividing an output voltage of the rectifier circuit, the control circuit performs switching control of turning on or off the switching element according to the divided voltage, and the plurality of resistor elements is a polysilicon layer or a metal layer arranged on a substrate.

19. The semiconductor memory device according to claim 10, wherein each of the first memory chip and the second memory chip includes at least one of a NAND flash memory and a NOR flash memory.

* * * * *